United States Patent
Choi (10) Patent No.: US 11,796,596 B2
(45) Date of Patent: Oct. 24, 2023

(54) METHOD OF MANAGING BATTERY, BATTERY MANAGEMENT SYSTEM, AND ELECTRIC VEHICLE CHARGING SYSTEM HAVING THE BATTERY MANAGEMENT SYSTEM

(71) Applicant: KOOKMIN UNIVERSITY INDUSTRY ACADEMY COOPERATION FOUNDATION, Seoul (KR)

(72) Inventor: Woongchul Choi, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 194 days.

(21) Appl. No.: 17/083,581

(22) Filed: Oct. 29, 2020

(65) Prior Publication Data
US 2021/0132152 A1    May 6, 2021

(30) Foreign Application Priority Data

Oct. 31, 2019    (KR) .................. 10-2019-0138056

(51) Int. Cl.
| | |
|---|---|
| G01R 31/36 | (2020.01) |
| G01R 31/388 | (2019.01) |
| B60L 58/12 | (2019.01) |
| H02J 7/00 | (2006.01) |
| H01M 10/42 | (2006.01) |
| H01M 10/44 | (2006.01) |
| H01M 10/48 | (2006.01) |

(52) U.S. Cl.
CPC .......... *G01R 31/3648* (2013.01); *B60L 58/12* (2019.02); *G01R 31/388* (2019.01); *H01M 10/425* (2013.01); *H01M 10/44* (2013.01); *H01M 10/48* (2013.01); *H02J 7/0069* (2020.01); *H02J 7/007186* (2020.01); *B60L 2240/427* (2013.01); *B60L 2240/80* (2013.01); *H01M 2010/4278* (2013.01); *H02J 2310/48* (2020.01)

(58) Field of Classification Search
CPC .... B60L 58/12; B60L 58/10; B60L 2240/427; B60L 2240/80; H01M 10/425; H01M 10/44; H01M 10/48; H01M 2010/4278; H01M 2010/4271; H01M 2220/20; H02J 7/0069; H02J 7/007186; H02J 2310/48; Y02T 10/64; Y02T 10/70; Y02E 60/10
See application file for complete search history.

(56) References Cited

U.S. PATENT DOCUMENTS

| | | | |
|---|---|---|---|
| 2010/0244886 A1* | 9/2010 | Kawahara | .......... G01R 31/3828 324/764.01 |
| 2016/0318417 A1* | 11/2016 | Suzuki | ................ H01M 10/486 |

FOREIGN PATENT DOCUMENTS

| | | | | |
|---|---|---|---|---|
| JP | 2015-121444 A | | 7/2015 | |
| JP | 2018169237 A | * | 11/2018 | ............. Y02E 60/10 |
| KR | 1999-0039187 A | | 6/1999 | |

* cited by examiner

*Primary Examiner* — Catherine T. Rastovski
*Assistant Examiner* — Lal C Mang
(74) *Attorney, Agent, or Firm* — Sughrue Mion, PLLC (57) ABSTRACT

A method of managing a battery is disclosed. The method is capable of efficiently managing a battery by measuring a state of charge (SOC) and an energy storage amount of the battery within a short time. A battery management system and an electric vehicle charging system having the battery management system are also disclosed.

13 Claims, 7 Drawing Sheets

METHOD OF MANAGING BATTERY, BATTERY MANAGEMENT SYSTEM, AND ELECTRIC VEHICLE CHARGING SYSTEM HAVING THE BATTERY MANAGEMENT SYSTEM

CROSS-REFERENCE TO RELATED APPLICATION

This application claims priority to and the benefit of Korean Patent Application No. 10-2009-0138056, filed on Oct. 31, 2019, the disclosure of which is incorporated herein by reference in its entirety.

BACKGROUND

1. Field of the Invention

The present invention relates to a method of managing a battery, a battery management system, and a system for charging an electric vehicle having the battery management system. More specifically, the present invention relates to a method of managing a battery, which is capable of efficiently managing a battery by measuring a state of charge (SOC) and an energy storage amount of the battery within a short time, a battery management system, and an electric vehicle charging system having the battery management system.

2. Discussion of Related Art

Vehicles using the conventional internal combustion engines are deeply related with the generation of pollution such as air pollution, and thus, recently, much effort has been put into the development of electric vehicles or hybrid vehicles using batteries.

However, when a battery is used as an energy source for an electric vehicle or a hybrid vehicle, since the battery directly affects the performance of the vehicle, a battery management system (BMS), which measures a voltage, a current, and an energy storage amount of the battery to inform a time point of a battery replacement or a charging or discharging time of a user, is required to efficiently manage the battery.

There are two commonly used methods of measuring an amount of energy remaining in a battery.

The first method is the most common open circuit voltage (OCV) method of measuring an amount of energy using a correlation between an OCV and a state of charge (SOC) of a battery. At the time of shipment, battery manufacturers provide a table or a graph in which a correlation between an OCV and an SOC is recorded. This method is a relatively simplified method and, when the battery is in a relatively healthy state before aging and an accurate OCV value is measured, measurement accuracy is excellent. However, in order to accurately measure an OCV, a voltage should be measured after stabilizing the battery in an open circuit state for a long period of time. Thus, when the OCV method is used in real time, measurement accuracy is very low.

The second method is a coulomb counting method of continuously measuring and integrating an amount of current used in a state in which a battery is fully charged and dividing the amount of integrated current by a total energy storage amount provided by a battery company, thereby calculating an SOC. Since the amount of current being actually used is integrated, measurement of a used amount of electric energy is relatively accurate. However, since the total energy storage amount provided by the battery company is decreased according to the aging of the battery, there is a disadvantage in that, the aging of the battery is not properly measured, it is inaccurate to predict an amount of electric energy remaining in the battery as compared with the used amount of electric energy. When the total energy storage amount of the battery is frequently measured and updated in the case of using the coulomb counting method, accuracy can be improved. However, the coulomb counting method takes at least four to five hours in order to measure a total energy amount with respect to the actual battery so that it is exceedingly difficult in reality.

As described above, the methods of monitoring a state of a battery according to the related art take a long time and thus are not suitable for a vehicle used in real time, so it is necessary to develop a method capable of measuring the state of the battery within a relatively short time.

RELATED ART DOCUMENT

Patent Document

Korean Patent Laid-Open Application No. 10-1999-0039187 (published on Jun. 5, 1999)

SUMMARY OF THE INVENTION

The present invention is directed to a method of managing a battery and a battery management system which are capable of efficiently managing a battery by measuring a state of charge (SOC) and an energy storage amount of the battery within a short time.

In addition, the present invention is also directed to a system for charging an electric vehicle having the battery management system, which is capable of efficiently managing a battery by measuring an energy storage amount during a charging time of an electric vehicle.

According to an aspect of the present invention, there is provided a method of managing a battery, which includes performing first charging or discharging on a battery; measuring a first voltage according to an open circuit of the battery after a first time between a time point immediately after the first charging or discharging and a time point before reaching a voltage stabilization period elapses; after the first charging or discharging, performing a second charging or discharging on the battery; measuring a second voltage according to the open circuit of the battery after a second time, which is equal to the first time, between a time point immediately after the second charging or discharging and before a time pint reaching of the voltage stabilization period, elapses; calculating a value ($SOC_1$) of a first SOC with respect to the first voltage and a value ($SOC_2$) of a second SOC with respect to the second voltage from a preset open circuit voltage (OCV)-SOC characteristic curve of the battery; and calculating a total energy storage amount ($Q_{max}$) of the battery using the first SOC value ($SOC_1$) and the second SOC value ($SOC_2$).

The calculating of the total energy storage amount ($Q_{max}$) of the battery may include calculating an energy variance ($\Delta Q$) of the battery according to the second charging or discharging through a coulomb counting method and calculate the total energy storage amount ($Q_{max}$) of the battery using the first SOC value ($SOC_1$), the second SOC value ($SOC_2$), and the energy variance ($\Delta Q$) of the battery according to Equation below:

$$Q_{max} = \frac{\Delta Q}{SOC_1 - SOC_2}, \qquad \text{[Equation]}$$

wherein ΔQ=integrated current value according to second charging or discharging

=∫i dt

The method of managing a battery may further include, after the calculating of the total energy storage amount ($Q_{max}$) of the battery, determining a charging time point or a replacement time point of the battery according to the calculated total energy storage amount $Q_{max}$ of the battery.

The performing of the second charging or discharging on the battery may include performing the second charging or discharging on the battery within the voltage stabilization period according to the first charging or discharging.

In addition, the performing of the second charging or discharging on the battery may include performing the second charging or discharging on the battery before a time point reaching the voltage stabilization period according to the first charging or discharging after the first time.

According to another aspect of the present invention, there is provided a battery management system including a load part configured to perform temporarily charging or discharging on a battery; a voltage measurement part configured to measure a voltage of the battery according to the performing of charging or discharging of the load part; and an arithmetic operation part configured to calculate an SOC from a preset OCV-SOC characteristic curve of the battery according to the voltage and calculate a total energy storage amount ($Q_{max}$) of the battery, wherein the load part performs first charging or discharging and second charging or discharging on the battery, and the voltage measurement part measures a first voltage according to an open circuit of the battery after a first time between a time point immediately after the first charging or discharging and before a time point reaching a voltage stabilization period elapses, and measures a second voltage according to the open circuit of the battery after a second time, which is equal to the first time, between a time point immediately after the second charging or discharging and a time point before reaching the voltage stabilization period elapses.

The arithmetic operation part may calculate a first SOC value ($SOC_1$) with respect to the first voltage and a second SOC value ($SOC_2$) with respect to the second voltage from the preset OCV-SOC characteristic curve of the battery and calculate the total energy storage amount ($Q_{max}$) of the battery using the first SOC value ($SOC_1$) and the second SOC value ($SOC_2$).

In addition, the arithmetic operation part may calculate an energy variance (ΔQ) of the battery according to the second charging or discharging through a coulomb counting method and calculate the total energy storage amount ($Q_{max}$) of the battery using the first SOC value ($SOC_1$), the second SOC value ($SOC_2$), and the energy variance (ΔQ) of the battery according to Equation below:

$$Q_{max} = \frac{\Delta Q}{SOC_1 - SOC_2}, \quad \text{[Equation]}$$

wherein ΔQ=integrated current value according to second charging or discharging

=∫i dt

The load part may perform the second charging or discharging on the battery within the voltage stabilization period according to the first charging or discharging.

In addition, the load part may perform the second charging or discharging on the battery before the time point reaching the voltage stabilization period according to the first charging or discharging after the first time.

According to still another aspect of the present invention, there is provided an electric vehicle charging system having the battery management system, which includes a charging device including a charging device main body and a charging connector connected to the charging device main body through a cable and connected to a charging port of the electric vehicle; a load part provided in the charging device and configured to perform charging or discharging on a battery in a state in which the charging connector is connected to an electric vehicle; a voltage measurement part provided in the charging device and configured to measure a voltage of the battery according to the performing of charging or discharging of the load part; and an arithmetic operation part configured to calculate an SOC from a preset OCV-SOC characteristic curve of the battery according to the voltage and calculate a total energy storage amount ($Q_{max}$) of the battery, wherein the load part performs first charging or discharging and second charging or discharging on the battery, and the voltage measurement part measures a first voltage according to an open circuit of the battery after a first time between a time point immediately after the first charging or discharging and before a time point reaching a voltage stabilization period elapses, and measures a second voltage according to the open circuit of the battery after a second time, which is equal to the first time, between a time point immediately after the second charging or discharging and before a time point reaching the voltage stabilization period elapses.

The electric vehicle charging system having the battery management system may further include a first wireless communication part configured to communicate with a mobile terminal of a user, wherein the first wireless communication part may transmit the first voltage and the second voltage to the mobile terminal of the user.

The electric vehicle charging system having the battery management system may further include a second wireless communication part configured to communicate with the mobile terminal of the user, and a battery management server equipped with the arithmetic operation part.

The arithmetic operation part may calculate the total energy storage amount ($Q_{max}$) of the battery using the first voltage and the second voltage through an energy storage amount calculation algorithm and transmit the total energy storage amount ($Q_{max}$) of the battery to the mobile terminal of the user through the second wireless communication part.

The arithmetic operation part may calculate a first SOC value ($SOC_1$) with respect to the first voltage and a second SOC value ($SOC_2$) with respect to the second voltage from the preset OCV-SOC characteristic curve of the battery and calculate the total energy storage amount ($Q_{max}$) of the battery using the first SOC value ($SOC_1$) and the second SOC value ($SOC_2$).

The arithmetic operation part may calculate an energy variance (ΔQ) of the battery according to the second charging or discharging through a coulomb counting method and calculate the total energy storage amount ($Q_{max}$) of the battery using the first SOC value ($SOC_1$), the second SOC value ($SOC_2$), and the energy variance (ΔQ) of the battery according to Equation below:

$$Q_{max} = \frac{\Delta Q}{SOC_1 - SOC_2}, \quad \text{[Equation]}$$

wherein ΔQ=integrated current value according to second charging or discharging

=∫i dt

The load part may perform the second charging or discharging on the battery within the voltage stabilization period according to the first charging or discharging.

The load part may perform the second charging or discharging on the battery before a time point reaching the voltage stabilization period according to the first charging or discharging after the first time.

BRIEF DESCRIPTION OF THE DRAWINGS

The above and other objects, features and advantages of the present invention will become more apparent to those skilled in the art by describing exemplary embodiments thereof in detail with reference to the accompanying drawings, in which.

DETAILED DESCRIPTION OF EXEMPLARY EMBODIMENTS

The present invention may be modified into various forms and may have a variety of example embodiments, and, therefore, specific embodiments will be illustrated in the accompanying drawings and described in detail. The embodiments, however, are not to be taken in a sense which limits the present invention to the specific embodiments, and should be construed to include modifications, equivalents, or substituents within the spirit and technical scope of the present invention. Also, in the following description of the present invention, when a detailed description of a known related art is determined to obscure the gist of the present invention, the detailed description thereof will be omitted herein.

Hereinafter, a method of managing a battery, a battery management system, and an electric vehicle charging system having the battery management system according to the present invention will be described in detail with reference to the accompanying drawings. In describing with reference to the accompanying drawings, the same or corresponding components are assigned as the same reference numerals, and duplicate descriptions thereof will be omitted therein.

Figure 1:
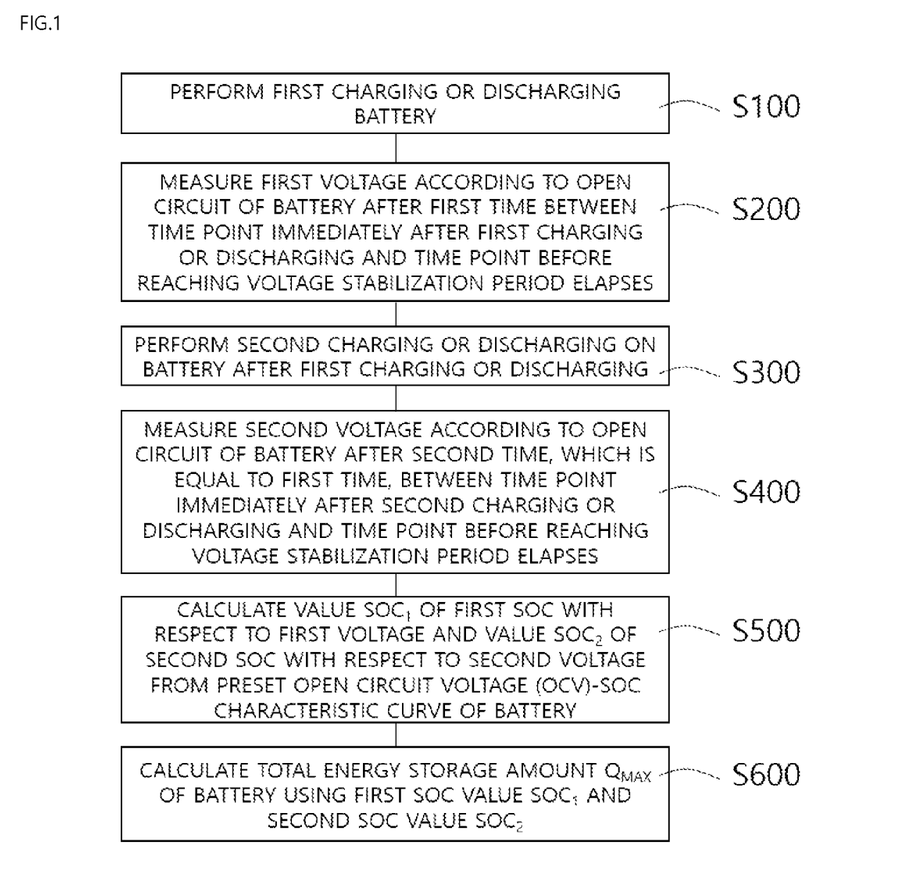
FIG. 1 is a flowchart illustrating a method of managing a battery according to a first embodiment of the present invention.
Figure 2:
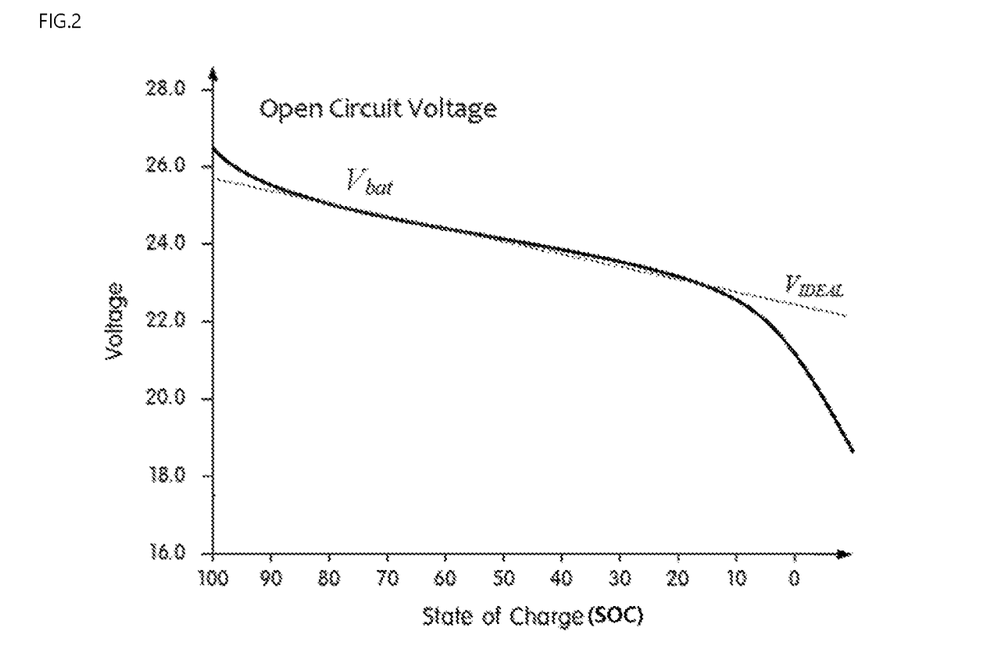
FIG. 2 is a graph showing an open circuit voltage (OCV)-state of charge (SOC) characteristic curve of a battery.
Figure 3:
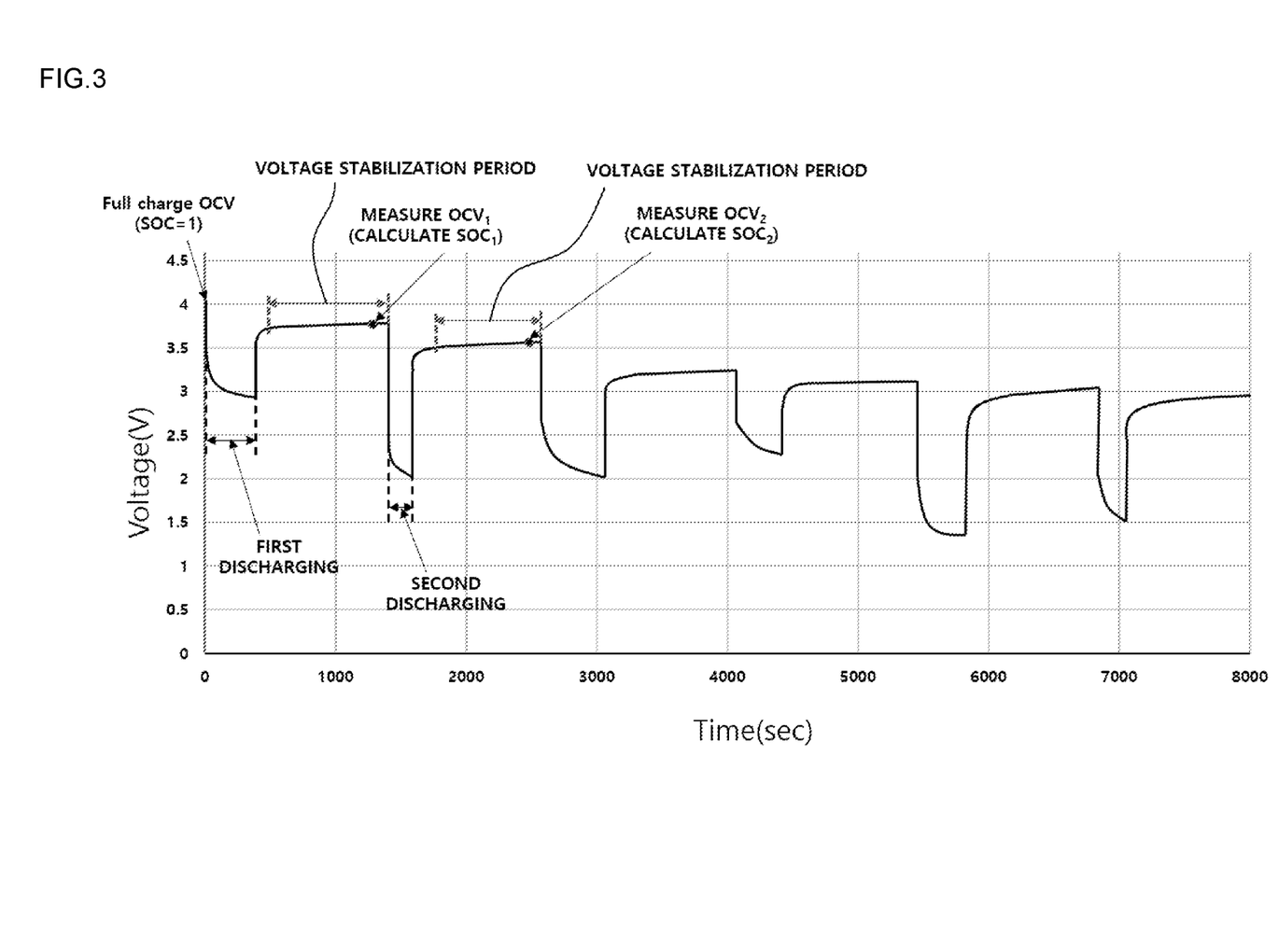
FIG. 3 is a graph for describing a general method of calculating a total energy storage amount of a battery.
Figure 4:
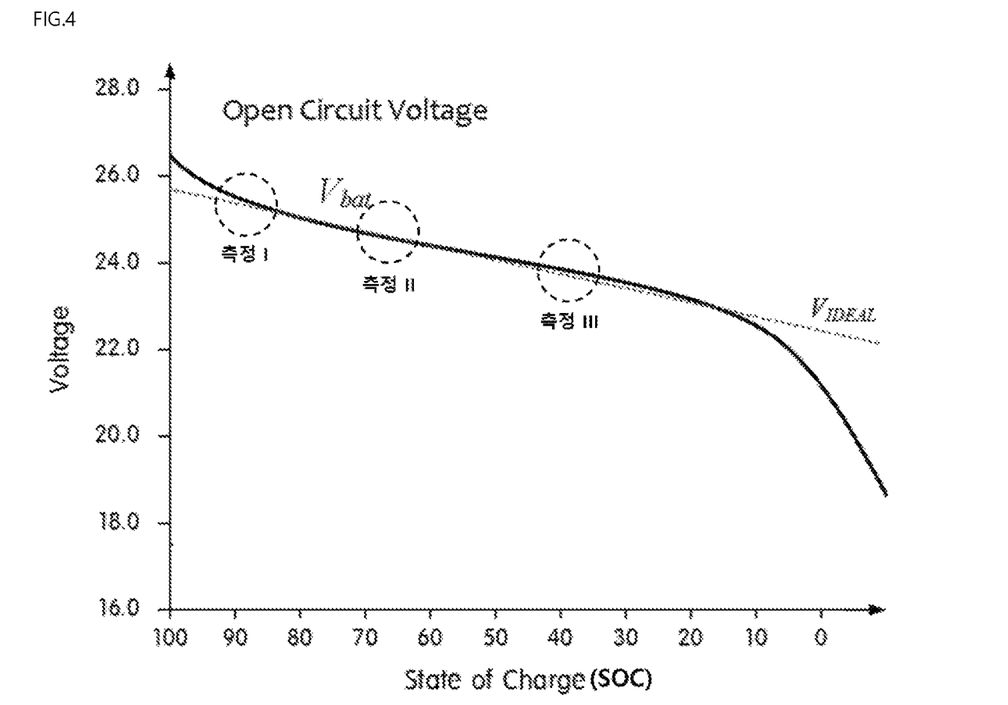
FIG. 4 is a graph for describing measurement positions of the method of managing a battery according to the first embodiment of the present invention.
Figure 5:
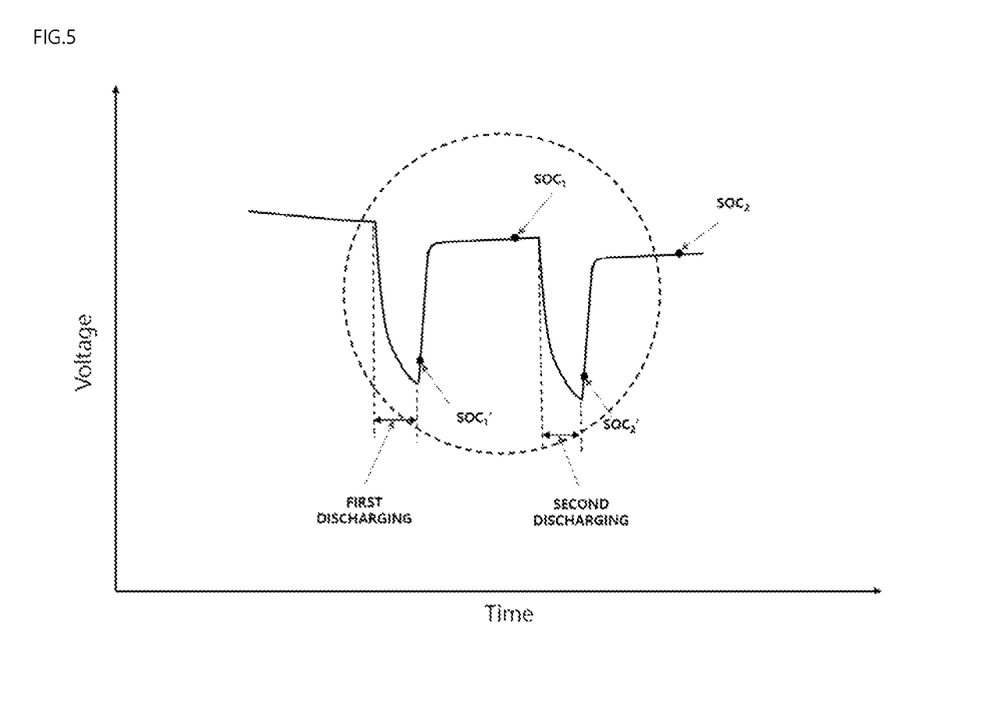
FIG. 5 is a graph for describing a measurement principle of the method of managing a battery according to the first embodiment of the present invention.
Figure 6:
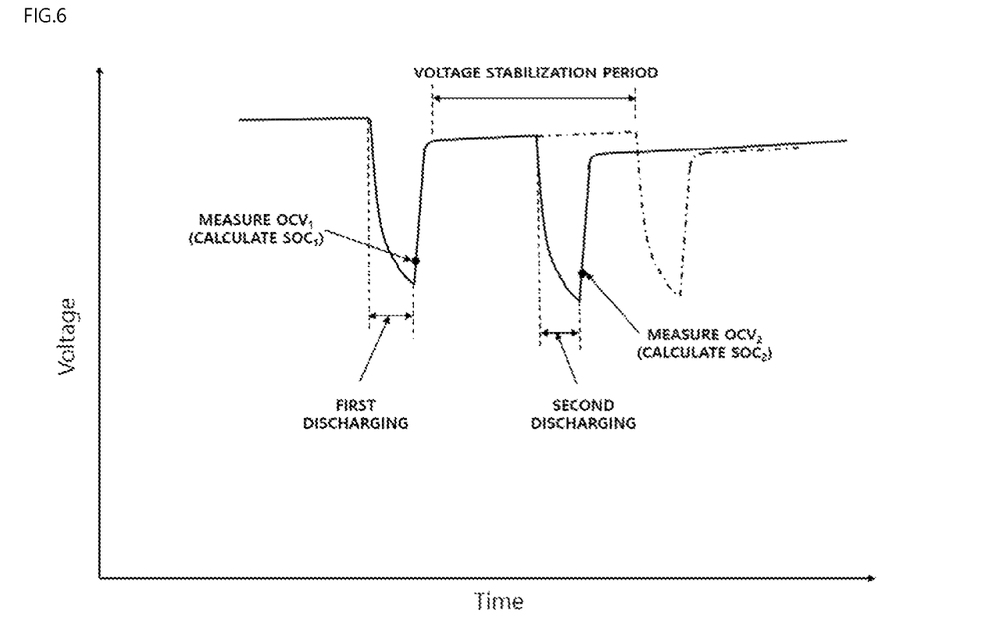
FIG. 6 is a graph for describing the method of managing a battery according to the first embodiment of the present invention.

FIG. 1 is a flowchart illustrating a method of managing a battery according to a first embodiment of the present invention. In addition, FIG. 2 is a graph showing an open circuit voltage (OCV)-state of charge (SOC) characteristic curve of a battery, and FIG. 3 is a graph for describing a general method of calculating a total energy storage amount of a battery. In addition, FIG. 4 is a graph for describing measurement positions of the method of managing a battery according to the first embodiment of the present invention, and FIG. 5 is a graph for describing a measurement principle of the method of managing a battery according to the first embodiment of the present invention. In addition, FIG. 6 is a graph for describing the method of managing a battery according to the first embodiment of the present invention.

The method of managing a battery according to the present embodiment includes performing first charging or discharging on a battery; measuring a first voltage according to an open circuit of the battery after a first time between a time point immediately after the first charging or discharging and a time point before reaching a voltage stabilization period elapses; performing second charging or discharging on the battery between a time point after the first charging or discharging and a time point before reaching the voltage stabilization period according to the first charging or discharging; measuring a second voltage according to the open circuit of the battery after a second time, which is equal to the first time, between a time point immediately after the second charging or discharging and a time point before reaching the voltage stabilization period, elapses; calculating a value $SOC_1$ of a first SOC with respect to the first voltage and a value $SOC_2$ of a second SOC with respect to the second voltage from a preset OCV-SOC characteristic curve of the battery; and calculating a total energy storage amount $Q_{max}$ of the battery using the first SOC value and the second SOC value.

The battery according to the present embodiment includes a secondary battery capable of charging electrons, such as a lead acid battery, a nickel cadmium battery, a lithium polymer battery, a lithium ion battery, a nickel hydride battery, or the like.

In FIG. 2, the OCV-SOC characteristic curve of the battery is shown. This OCV-SOC characteristic curve is merely the first embodiment and may be different for each battery. A battery has a characteristic in which a voltage is varied according to an SOC, and an OCV-SOC characteristic curve shows the variation in voltage. The OCV-SOC characteristic curve is provided by a battery manufacturer at the time of shipment. When the OCV-SOC characteristic curve is not present, an experiment with respect to a battery may be carried out in advance in a laboratory or the like, and an OCV-SOC characteristic curve of a current state with respect to a corresponding battery may be obtained.

In the present embodiment, the OCV-SOC characteristic curve is provided in the form of a graph, and it is also provided in the form of a table. Alternatively, it is possible to draw the OCV-SOC characteristic curve by matching an OCV value to an SOC value, which are provided in the table. When an OCV of the battery is measured using such an OCV-SOC characteristic curve, a current SOC value of the battery may be estimated.

Referring to FIG. 2, it can be seen that a voltage in a charging state and a voltage in a discharging state of the battery are non-linearly changed in a fully charged state and a discharged state. In FIG. 2, the SOC value is expressed as a ratio (%) of an energy storage amount in the current state to a total energy storage amount in the fully charged state.

Hereinafter, a method of calculating a total energy storage amount of a general battery will be described first with reference to FIG. 3.

As a method of measuring a total energy storage amount remaining in a battery, a method of calculating an SOC value $SOC_1$ at a first specific time point and an SOC value $SOC_2$ at a second specific time point different from the first specific time point without charging or discharging a battery at a level of 100%, and calculating a total energy storage amount $Q_{max}$ through a difference between the SOC value $SOC_1$ and the SOC value $SOC_2$ using Equation 1 below has been proposed.

$$Q_{max} = \frac{\Delta Q}{SOC_1 - SOC_2} \quad \text{[Equation 1]}$$

Here, $\Delta Q$=integrated current value according to second charging or discharging $=\int i\, dt$ In order to calculate the SOC value $SOC_1$ at the first specific time point and the SOC value $SOC_2$ at the second specific time point, the OCV-SOC characteristic curve is used. As shown in FIG. 3, in order to measure an accurate OCV, a voltage should undergo a voltage stabilization period in which the voltage is stabilized to a constant value in a state in which the charging or discharging of the battery does not occur.

Thus, in order to measure the SOC value $SOC_1$ at the first specific time point and the SOC value $SOC_2$ at the second specific time point, since a time of at least two voltage stabilization periods elapses, it takes a long time to calculate the total energy storage amount $Q_{max}$ of the battery.

Referring to FIG. 3, it can be seen that the voltage of the battery rapidly drops while a first discharging is performed, and, when the first discharging stops, the voltage rapidly rises and then very slowly reaches the voltage stabilization period. In this case, the SOC value $SOC_1$ at the first specific time point is calculated through the OCV-SOC characteristic curve. Thereafter, when a second discharging is performed and then stopped, the voltage rapidly rises again and then very slowly reaches the voltage stabilization period. Again, the SOC value $SOC_2$ at the second specific time point is calculated through the OCV-SOC characteristic curve. As described above, it can be seen that since the at least two voltage stabilization period time points should be passed, it takes a long time to calculate the total energy storage amount $Q_{max}$ of the battery.

The present invention proposes a method of efficiently managing a battery by minimizing a time for calculating the $SOC_1$ value and the $SOC_2$ value to calculate the total energy storage amount remaining in the battery.

Hereinafter, a measurement principle of the method of managing a battery will be described with reference to FIGS. 4 and 5.

FIG. 4 shows a setting of a measurement operation according to a level of an SOC value in accordance with the method of managing a battery according to the present embodiment. Measurement I means that a total energy storage amount is calculated at about 90% of an SOC value of the battery to determine a battery condition, Measurement II means that the total energy storage amount is calculated at about 70% of the SOC value of the battery to determine the battery condition, and Measurement III means that the total energy storage amount is calculated at about 40% of the SOC value of the battery to determine the battery condition.

FIG. 5 is a graph for describing the measurement principle of the method of managing a battery according to the present embodiment. According to the applicant's experiment, as shown in FIG. 5, it can be seen that, when the second discharging is performed again without the elapse of a long time after the first discharging is performed, patterns of the voltages which recover immediately after the performing of the first discharging and immediately after the performing of the second discharging are the same or similar to each other.

In this case, the meaning of "the second discharging is performed again without the elapse of a long time after the first discharging is performed" means that a time difference between the performing of the first discharging and the performing of the second discharge is not large. This means that the first discharging and the second discharging are performed at positions where the SOC values are at similar levels in FIG. 4. For example, the above description means that the first discharging and the second discharging should be performed in each of Measurement I, Measurement II, and Measurement III.

FIG. 5 shows recovery patterns of "discharging," and recovery patterns of the voltages are the same as or similar to those even in the case of performing the second charging again without the elapse of a long time after the first discharging is performed, that is, the "charging."

Meanwhile, according to Equation 1, it can be seen that, when a difference ($SOC_1$–$SOC_2$) between the $SOC_1$ value at the first specific time point and the $SOC_2$ value at the second specific time point is known, the total energy storage amount $Q_{max}$ may be calculated.

As shown in FIG. 5, according to a general method, a voltage is measured in the voltage stabilization period after the first discharging is performed to calculate the $SOC_1$ value, and a voltage is measured again in the voltage stabilization period after the second discharging is performed to calculate the $SOC_2$ so that the total energy storage amount $Q_{max}$ is calculated according to Equation 1 using the difference between the $SOC_1$ value and the $SOC_2$ value. When the second discharging is performed without the elapse of a long time after the first discharging is performed, since patterns of which the voltage recoveries are the same or very similar to each other, without the calculation of the $SOC_1$ value and the $SOC_2$ value in the voltage stabilization period, voltages are measured at the same voltage recovery time point immediately after the first discharging and the second discharging, and thus an $SOC_1'$ value and an $SOC_2'$ value may be calculated through the measured voltages and the total energy storage amount $Q_{max}$ may be calculated according to Equation 1 using a difference between the SOC value and the $SOC_2'$ value.

Hereinafter, according to the above principle, the method of managing a battery according to the present embodiment will be described with reference to FIG. 6.

First, first charging or discharging is performed on the battery (S100). Here, the "charging or discharging" refers to perform charging or discharging on the battery. When "charging" is performed in the performing of the first charging or discharging, the same "charging" is performed in the performing of the second charging or discharging, and, when "discharging" is performed in the performing of the first charging or discharging, the same "discharging" is performed in the performing of the second charging or discharging. In the present embodiment, a description thereof will be made focusing on the performing of the "discharging."

Meanwhile, in the present embodiment, the meaning of the performing of "charging or discharging" means to include a case in which "charging" or "discharging" is artificially performed on the battery so as to determine a state of the battery and a case in which "charging" or "discharging" naturally occurs during use of the battery. For example, in the case of a battery used in an electric vehicle or a hybrid vehicle, it is possible to determine a management state of the battery using "charging" or "discharging" which naturally occurs in the battery while the vehicle is traveling. Next, a first voltage according to an open circuit of the battery is measured after a first time between a time point immediately after the first charging or discharging and a time point before reaching a voltage stabilization period elapses (S200). Referring to FIG. 6, the first voltage according to the open circuit of the battery is measured at a time point when the voltage is rapidly recovered after the first discharging is performed and before reaching the voltage stabilization period. According to the common method, the first voltage is measured in the voltage stabilization period after the first discharging. However, in the present embodiment, the first voltage is measured at a time point immediately after the first charging or discharging and before reaching the voltage stabilization period without a delay of a long time after the first discharging is performed.

Next, after the first charging or discharging, the second charging or discharging is performed on the battery (S300). As described above, the second discharging is performed again without the elapse of a long time after the first discharging is performed. That is, the second discharging is performed at a level of an SOC value in which patterns of which voltages recover after the performing of the first discharging are exhibited to be the same or similar to each other.

When the management state of the battery is determined using "charging" or "discharging" naturally occurring in the battery, the determination is performed by selecting the first discharging which naturally occurs during use of the battery or the second discharging or charging which occurs without the elapse of a long time with respect to the first discharging or the first charging.

In the present embodiment, as shown in FIG. 6, the second discharging is performed on the battery at a time point within the original voltage stabilization period after the performing of the first discharging so that a calculation time of the SOC value is reduced.

Next, a second voltage according to the open circuit of the battery is measured after a second time, which is equal to the first time, between a time point immediately after the second charging or discharging and a time point before reaching the voltage stabilization period elapses (S400). Referring to FIG. 6, after the second time which is equal to the first time elapses, the second voltage according to the open circuit of the battery is measured at a time point at which a voltage is rapidly recovered after the performing of the second discharging and before the reaching of the voltage stabilization period. Since the second voltage is measured at the second time at the time of the voltage recovery according to the second discharging as the same as the first time at the time of the voltage recovery according to the first discharging, a voltage difference has the same ratio as the voltage difference between the voltages measured in the voltage stabilization period according to the first discharging and the second discharging.

As described above, even when the voltage stabilization period is not reached after the performing of the first discharging, the second discharging is performed and then the voltages are measured so that calculation times of SOC values and a total energy storage amount $Q_{max}$ may be significantly reduced.

Next, a value $SOC_1$ of a first SOC with respect to the first voltage and a value $SOC_2$ of a second SOC with respect to the second voltage are calculated from a preset OCV-SOC characteristic curve of the battery (S500). The value $SOC_1$ of the first SOC corresponding to a first voltage value and the value $SOC_2$ of the second SOC corresponding to a second voltage value are calculated using the OCV-SOC characteristic curve or a table.

Next, the total energy storage amount $Q_{max}$ of the battery is calculated using the first SOC value $SOC_1$ and the second SOC value $SOC_2$ (S600). The total energy storage amount $Q_{max}$ of the battery may be calculated through Equation 1 which is described above. First, an energy variance $\Delta Q$ of the battery according to the second discharging is calculated according to a coulomb counting method.

As described above, although the first voltage and the second voltage are not measured in the voltage stabilization period according to the first discharging and the second discharging, according to Equation 1, since the total energy storage amount $Q_{max}$ may be determined by a difference ($SOC_1$–$SOC_2$) between the $SOC_1$ value at the first specific time point and the $SOC_2$ value at the second specific time point, a more accurate total energy storage amount $Q_{max}$ may be calculated.

The total energy storage amount $Q_{max}$ of the battery, which is calculated according to the above description, is a value reflecting a degree of aging of the battery, and a time for charging or replacing the battery may be determined using the total energy storage amount $Q_{max}$.

The above described method of managing a battery may be applied to vehicles such as electric vehicles and hydride vehicles and applied to various electronic devices using batteries.

Figure 7:
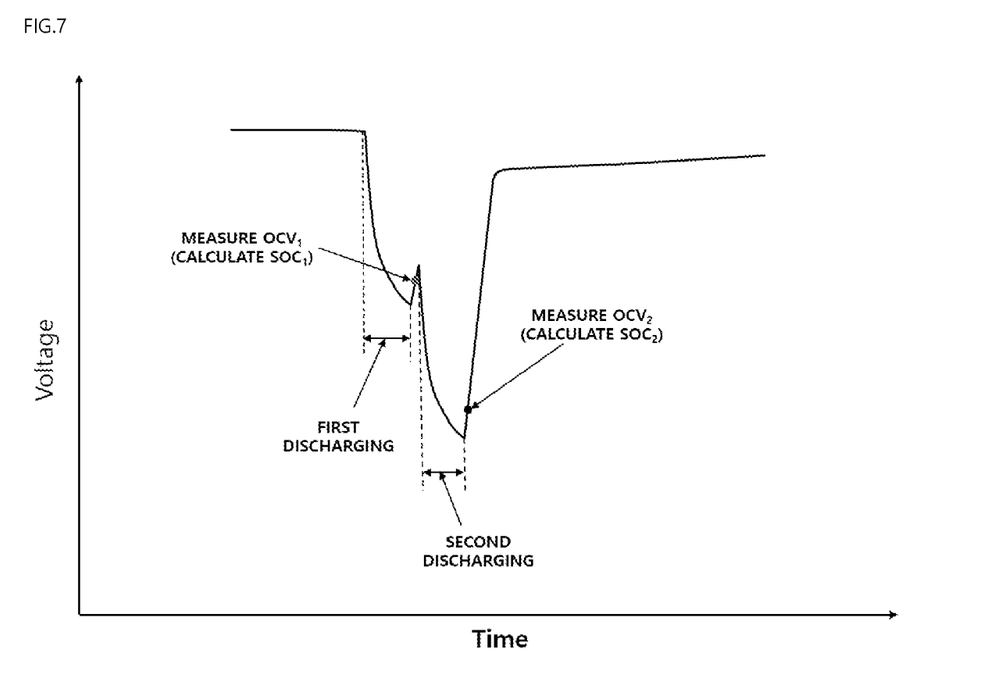
FIG. 7 is a graph for describing a method of managing a battery according to a second embodiment of the present invention.

FIG. 7 is a graph for describing a method of managing a battery according to a second embodiment of the present invention.

Unlike the first embodiment, in the present embodiment, second charging or discharging is performed earlier than the time point of the second charging or discharging in the first embodiment so that a calculation time of the total energy storage amount $Q_{max}$ of the battery may be further reduced.

As shown in FIG. 6, in the first embodiment, the second discharging is performed on the battery at a time point in the original voltage stabilization period after the performing of the first discharging. As shown in FIG. 7, in this embodiment, the second charging or discharging is performed on the battery at one time between a time point after a first time which is a voltage measurement time according to the first charging or discharging and a point time before reaching a voltage stabilization period according to the first charging or discharging, that is, at one time point at which a voltage is rapidly recovered so that a calculation time of the SOC value is significantly reduced. Referring to FIG. 7, it can be seen that a first voltage is measured after the first discharge is performed and then the first time elapses, and the second discharging is immediately performed. Even in the present embodiment, a second voltage according to an open circuit of the battery is measured after a second time, which is equal to the first time, between a time point immediately after the second discharging and a time point before reaching the voltage stabilization period elapses.

According to the present embodiment, an $SOC_1$ value and an $SOC_2$ value are calculated with respect to the first voltage and the second voltage, respectively, so that a measurement time of the total energy storage amount $Q_{max}$ of the battery may be significantly reduced.

Figure 8:
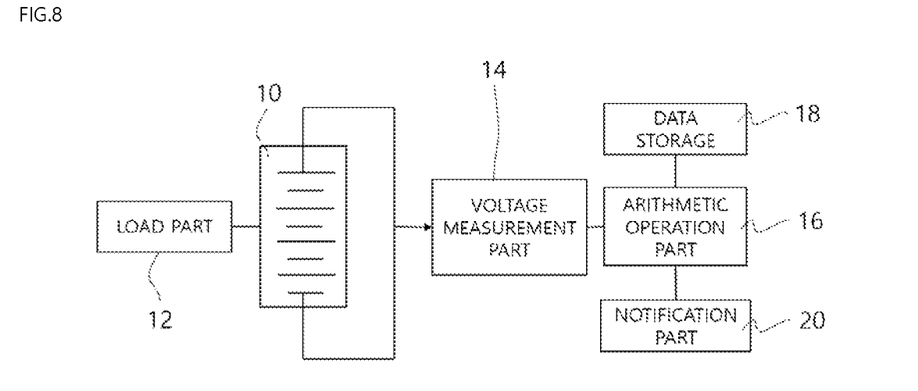
FIG. 8 is a schematic block diagram illustrating a battery management system according to a third embodiment of the present invention.

FIG. 8 is a schematic block diagram illustrating a battery management system according to a third embodiment of the present invention. In FIG. 8, a battery 10, a load part 12, a voltage measurement part 14, an arithmetic operation part 16, a data storage 18, and a notification part 20 are shown.

The present embodiment relates to a battery management system for performing the above described method of managing a battery. The battery management system includes the load part 12 for temporarily charging or discharging the battery 10, the voltage measurement part 14 for measuring a voltage of the battery 10 according to the charging or discharging of the load part 12, and an arithmetic operation part 16 for calculating SOC values from a preset OCV-SOC characteristic curve of the battery 10 according to the measured voltage and calculating a total energy storage amount $Q_{max}$ of the battery 10.

The load part 12 may first charging or discharging and second charging or discharging on the battery 10, and the voltage measurement part 14 may measure a first voltage according to an open circuit of the battery 10 after a first time between a time point immediately after the first charging or discharging and a time point before reaching a voltage stabilization period elapses and measure a second voltage according to the open circuit of the battery 10 after a second time, which is equal to the first time, between a time point immediately after the second charging or discharging and a time point before reaching the voltage stabilization period elapses to reduce a calculation time of SOC values according to the first voltage and the second voltage, thereby more efficiently managing the battery 10.

The arithmetic operation part 16 calculates a first SOC value $SOC_1$ with respect to the first voltage and a second SOC value $SOC_2$ with respect to the second voltage from the preset OCV-SOC characteristic curve of the battery 10 and calculates a total energy storage amount $Q_{max}$ of the battery 10 using the first SOC value $SOC_1$ and the second SOC value $SOC_2$. In this case, through a coulomb counting method, the arithmetic operation part 16 calculates an energy variance $\Delta Q$ of battery 10 according to the second charging or discharging and calculates the total energy storage amount $Q_{max}$ of the battery 10 using the first SOC value $SOC_1$, the second SOC value $SOC_2$, and the energy variance $\Delta Q$ of the battery 10 according to Equation 1 which is described above.

In order to reduce the calculation time of the SOC values of the battery 10, it is particularly important to determine a time point of the second charging or discharging. The load part 12 performs the second charging or discharging on the battery 10 within the voltage stabilization period according to the first charging or discharging or performs the second charging or discharging on the battery 10 before reaching the voltage stabilization period according to the first charging or discharging after the first time so that it is possible to reduce the calculation times of the SOC values and the total energy storage amount $Q_{max}$.

The total energy storage amount $Q_{max}$ of the battery 10 calculated according to the battery management system is a value reflecting a degree of aging of the battery 10. Using the total energy storage amount $Q_{max}$, a time point for charging or replacing the battery 10 may be notified to a user through the notification part 20.

The data storage 18 stores the voltages, the SOC values, and the total energy storage amount $Q_{max}$ as data at every measurement time point. The stored data may be used to determine the time point for charging or replacing the battery 10.

Figure 9:
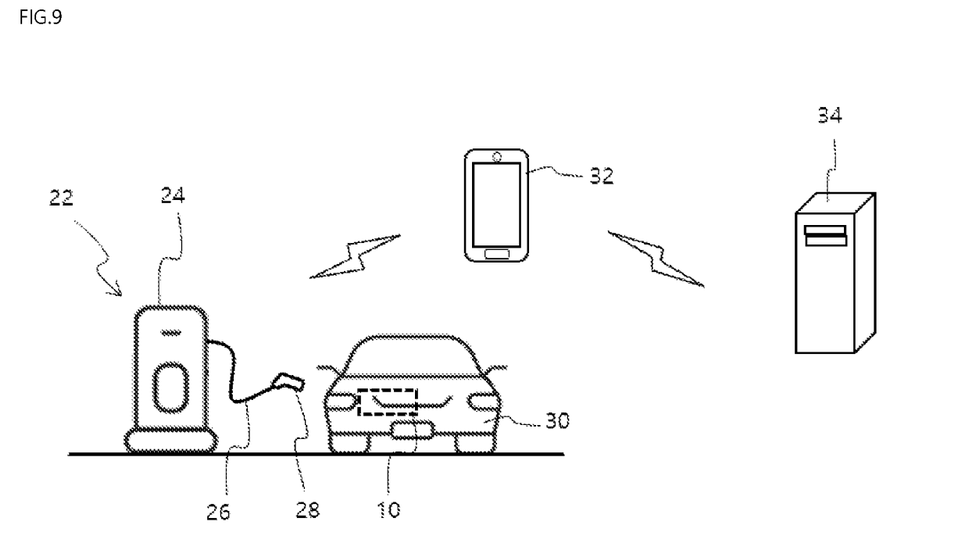
FIG. 9 is a configurational diagram illustrating an electric vehicle charging system having the battery management system according to a fourth embodiment of the present invention.
Figure 10:
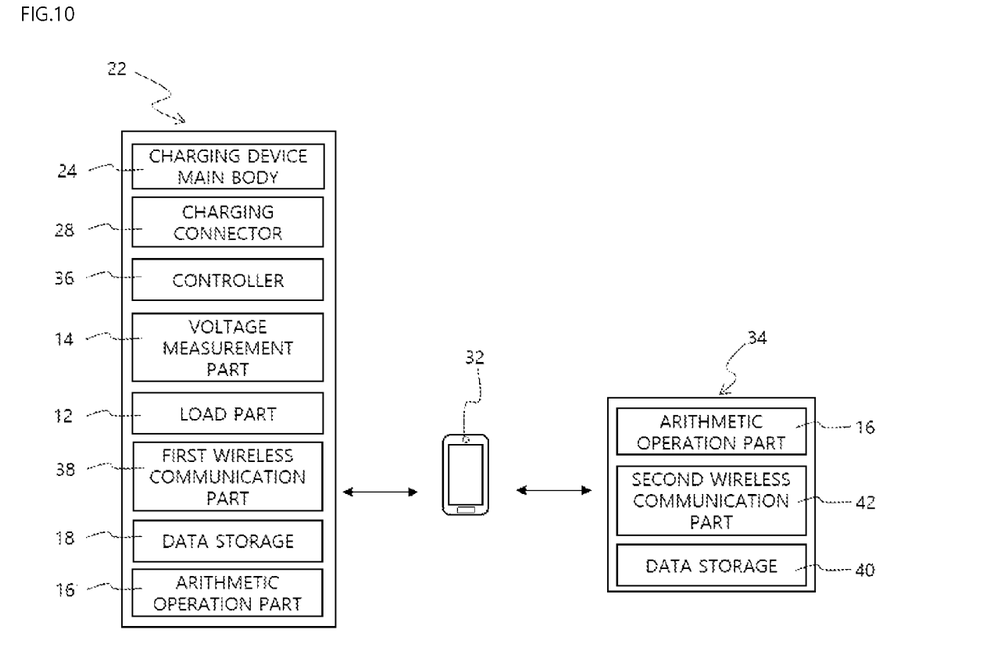
FIG. 10 is a block diagram illustrating the electric vehicle charging system having the battery management system according to the fourth embodiment of the present invention.

FIG. 9 is a configurational diagram illustrating an electric vehicle charging system having the battery management system according to a fourth embodiment of the present invention, and FIG. 10 is a block diagram illustrating the electric vehicle charging system having the battery management system according to the fourth embodiment of the present invention.

In FIGS. 9 and 10, a charging device 22, a charging device main body 24, a cable 26, a charging connector 28, an electric vehicle 30, a battery 10, a mobile terminal 32, a battery management server 34, a controller 36, a voltage measurement part 14, a load part 12, a first wireless communication part 38, data storages 18 and 40, an arithmetic operation parts 16 and 16', and a second wireless communication part 42 are shown.

The electric vehicle charging system having the battery management system according to the present embodiment includes the charging device 22 including the charging device main body 24 and the charging connector 28 connected thereto through the cable 26 and connected to a charging port of the electric vehicle 30, the load part 12 provided in the charging device 22 and configured to charge or discharge the battery 10 in a state in which the charging connector 28 is connected to the electric vehicle 30, the voltage measurement part 14 provided in the charging device 22 and configured to measure a voltage of the battery 10 according to the charging or discharging of the load part 12, and the arithmetic operation part 16 configured to calculate an SOC value from a preset OCV-SOC characteristic curve of the battery 10 according to the voltage and calculate a total energy storage amount $Q_{max}$ of the battery 10.

The present embodiment is implemented in the form in which the above described battery management system is combined with an electric vehicle charging system. During a charging time of the electric vehicle 30, an energy storage amount of the battery 10 is measured and is continuously managed so that the battery 10 of the electric vehicle 30 may be efficiently managed.

The charging device main body 24 may be installed in a parking lot or an electric vehicle charging station as a main body for supplying electric power to the electric vehicle 30 through the charging connector 28. A license plate number identifier capable of identifying a license plate number of the electric vehicle 30, an unmanned toll collection system, and the like are installed in the charging device main body 24 so that the user of charging the electric vehicle 30 may be charged.

The charging connector 28 is connected to the charging device main body 24 through the cable 26 and connected to the charging port of the electric vehicle 30. The charging connector 28 is a device which is electrically connected to the electric vehicle 30 so as to supply power to thereto and connected to the charging port of the electric vehicle 30. The charging connector 28 may be replaced according to a shape of the charging port of the electric vehicle 30.

Meanwhile, the charging connector 28 according to the present embodiment is a component which is electrically connected to the electric vehicle 30 and serves to transmit various signals so as to obtain state information of the battery 10 in addition to a function of supplying power.

The charging device 22 including the charging device main body 24 and the charging connector 28 may perform rapid charging for directly supplying direct current (DC) power to the battery 10 of the electric vehicle 30 or perform slow charging for supplying alternating current (AC) to an on-board charger (OBC) of the electric vehicle 30.

The electric vehicle charging system according to the present embodiment may supply electric power to the electric vehicle 30 to charge the battery 10 of the electric vehicle 30 and manage information on the battery 10 embedded in the electric vehicle 30 according to a method which will be described below.

Meanwhile, the battery 10 embedded in the electric vehicle 30 according to the present embodiment includes a secondary battery capable of charging electrons, such as a lead acid battery, a nickel cadmium battery, a lithium polymer battery, a lithium ion battery, a nickel hydride battery, or the like.

The load part 12 is provided in the charging device 22 and performs charging or discharging by applying a load to the battery 10 in a state in which the charging connector 28 is connected to the electric vehicle 30. The load part 12 may be embedded in the charging device main body 24 or the charging connector 28 and perform the charging or discharging by temporarily applying a load to the battery 10 of the electric vehicle 30 in the state in which the charging connector 28 is connected to the electric vehicle 30.

The voltage measurement part 14 is also provided in the charging device 22 and measures the voltage of the battery 10. The load part 12 performs first charging or discharging and second charging or discharging on the battery 10, and the voltage measurement part 14 measures the voltage of battery 10 after the charging or discharging of the load part 12. In this case, a measurement time may also be measured.

Configurations of the load part 12 and the voltage measurement part 14 are the same as the above description thereof, and thus detailed descriptions thereof will be omitted herein.

The arithmetic operation parts 16 and 16' calculate the total energy storage amount $Q_{max}$ of the battery 10 using the voltage according to the charging or discharging of the load part 12.

The present embodiment is configured such that the arithmetic operation part 16 is provided in the battery management server 34 to calculate the total energy storage amount $Q_{max}$ of the battery 10 from the transmitted voltage. Alternatively, it is also possible to calculate the total energy storage amount $Q_{max}$ of the battery 10 immediately after the voltage is measured by providing the arithmetic operation part 16' in the charging device 22.

The data storage 18 stores battery state information on voltages such as a first voltage and a second voltage, the SOC value, and the total energy storage amount $Q_{max}$ as data at every measurement time point. The stored data may be used to determine a time point for charging or replacing the battery 10.

The data storage 18 may temporarily or permanently store the battery state information. The total energy storage amount $Q_{max}$ of the battery 10 embedded in the electric vehicle 30 is calculated using the battery state information stored in the data storage 18 so that it is possible to determine a replacement time point or a charging period of the battery 10. In addition, the data storage 18 may store charging information including a charging time, a charging history, and a charging amount of a corresponding electric vehicle 30 at every charging and calculate a charging pattern of the electric vehicle 30 on the basis of the charging information to provide a management state of the battery 10.

The first wireless communication part 38 is provided in the charging device 22 and communicates with the mobile terminal 32 of the user. When the electric vehicle 30 is charged, the first wireless communication part 38 may be connected to the mobile terminal 32 owned by the user adjacent to the charging device 22 and transmit battery state information, such as the first voltage and the second voltage of a corresponding battery 10 measured in the charging device 22, to the mobile terminal 32 of the user.

The mobile terminal 32 is a terminal equipped with a wireless function such as a smart phone, and a related application is installed in the mobile terminal 32 so that the mobile terminal 32 may receive battery state information of a corresponding battery 10, which is transmitted from the first wireless communication part 38.

A short-range wireless communication network such as Bluetooth, ZigBee, or Wi-Fi may be used as the first wireless communication part 38. The battery state information received through the first wireless communication part 38 is transmitted to the battery management server 34 again through the mobile terminal 32 of the user.

The controller 36 of the charging device 22 controls whether to charge the electric vehicle 30 and controls operations of the load part 12 and the voltage measurement part 14 and whether to transmit the battery state information through the first wireless communication part 38.

The battery management server 34 may include the second wireless communication part 42 which communicates with the mobile terminal 32 of the user and the arithmetic operation part 16 which calculates the total energy storage amount $Q_{max}$ of the battery 10 from the battery state information.

The battery management server 34 may receive battery state information from each of the mobile terminals 32 of a plurality of users and manage the battery state information, thereby managing batteries 10 of a plurality of electric vehicles 30.

The second wireless communication part 42 includes a wide area wireless communication network such as the Internet or a mobile communication network and communicates with the mobile terminal 32 of the user through the wide area wireless communication network.

While the electric vehicle 30 is charged, the charging device 22 transmits the battery state information to the mobile terminal 32 of the user through a short-range communication network, and the mobile terminal 32 of the user transmits the battery state information to the battery management server 34 through a wide area wireless communication network so that the battery state information of the battery 10 may be transmitted to the battery management server 34 without installation of the wide area wireless communication network in the charging device 22.

The present embodiment is configured such that the battery state information of the battery 10 is transmitted to the battery management server 34 through the mobile terminal 32 of the user. However, the present embodiment may be configured such that a wide area wireless communication network is installed in the charging device 22, and thus battery state information of the battery 10 is directly transmitted to the battery management server 34 without using the mobile terminal 32 of the user.

The arithmetic operation part 16 of the battery management server 34 includes an energy storage amount calculation algorithm which calculates the total energy storage amount $Q_{max}$ of the battery 10 from the transmitted battery state information. The total energy storage amount $Q_{max}$ of the battery 10 calculated through the energy storage amount calculation algorithm is transmitted to the mobile terminal 32 of the user again through the second wireless communication part 42 so that the user may check the total energy storage amount $Q_{max}$ of the battery 10 embedded in an electric vehicle 30 owned by the user.

The present embodiment is configured such that the total energy output $Q_{max}$ of the battery 10 is transmitted to the mobile terminal 32 of the user. However, the total energy storage amount $Q_{max}$ of the battery 10 is directly transmitted from the battery management server 34 to the charging device 22 so that the user may check the total energy storage amount $Q_{max}$ of the battery 10 of the electric vehicle 30 owned by the user through a display of the charging device 22.

Meanwhile, the arithmetic operation part 16 of the battery management server 34 may include a plurality of different energy storage amount calculation algorithms. In this case, the user may select any one among the plurality of energy storage amount calculation algorithms through the mobile terminal 32 of the user. The total energy storage amount $Q_{max}$ of the battery 10 may be calculated through an energy storage amount calculation algorithm selected according to the selection of the user.

Currently, various studies on a method of calculating the total energy storage amount $Q_{max}$ of the battery 10 are underway. However, in fact, there is no clearly suggested method of accurately calculating the total energy storage amount $Q_{max}$ of the battery 10. Thus, a reliable energy storage amount calculation algorithm is provided by the battery management server 34 and the user selects the reliable energy storage amount calculation algorithm so that reliability of management of the battery 10 may be increased.

The energy storage calculation algorithms may be provided to the battery management server 34 by various research groups, and an administrator may select a reliable energy calculation algorithm among the energy storage calculation algorithms and register the selected reliable energy calculation algorithm in the arithmetic operation part 16 so that the user may select the registered reliable energy calculation algorithm.

In addition, since the data storage 40 is provided even in the battery management server 34, pieces of battery state information transmitted from the mobile terminals 32 of the plurality of users and the total energy storage amount $Q_{max}$ calculated from the pieces of battery state information may be stored and provided to the users at any time. In addition, the data storage 40 of the battery management server 34 stores charging information including a charging time, a charging history, and a charging amount of a corresponding electric vehicle 30 at every charging, and battery management such as notification of a replacement time point and a charging time point of the battery 10 of the electric vehicle 30 may be performed on the basis of the stored charging information.

Figure 11:
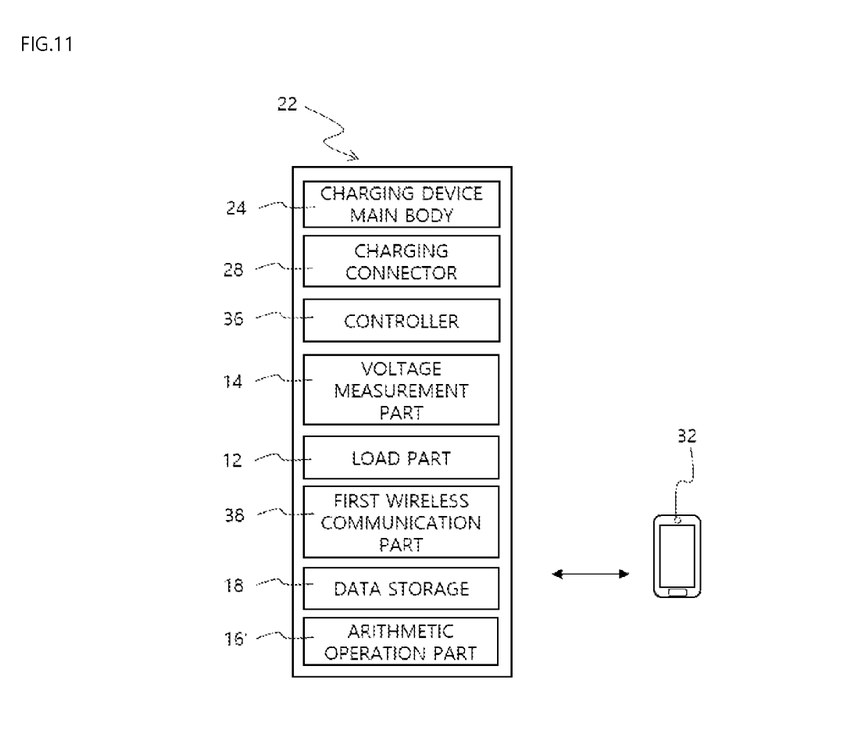
FIG. 11 is a block diagram illustrating an electric vehicle charging system having the battery management system according to a fifth embodiment of the present invention.

FIG. 11 is a block diagram illustrating an electric vehicle charging system having the battery management system according to a fifth embodiment of the present invention.

In FIG. 11, a charging device 22, a charging device main body 24, a cable 26, a charging connector 28, a mobile terminal 32, a controller 36, a voltage measurement part 14, a load part 12, a data storage 18, an arithmetic operation part 16', and a first wireless communication part 38 are shown.

Unlike the above embodiments, the present embodiment is implemented in the form in which a separate battery management server is not provided and the arithmetic operation part 16' calculating a total energy storage amount $Q_{max}$ and the first wireless communication part 38 capable of communicating with the mobile terminal 32 of a user are disposed in the charging device 22.

When the charging connector 28 of the charging device 22 is connected to a charging port of the electric vehicle 30 so as to charge the electric vehicle 30, after a charging or discharging operation of the load 12, the voltage measurement part 14 measures a first voltage and a second voltage and then stores the measured first voltage and the second voltage in the data storage 18. The arithmetic operation part 16' calculates the total energy storage amount $Q_{max}$ of the battery 10 from the first voltage and the second voltage according to the above described method and transmits the calculated total energy storage amount $Q_{max}$ to the mobile terminal 32 of the user through the first wireless communication part 38.

Alternatively, even in the present embodiment, when a separate battery management server is provided and battery state information, a battery charging time, a charging history, and a charging amount are transmitted to the battery management server in a process of charging the battery 10 of the electric vehicle 30, a replacement time point and a charging time point of the battery 10 of the electric vehicle 30 may be managed on the basis of the battery state information, the battery charging time, the charging history, and the charging amount.

In accordance with the embodiments of the present invention, it is possible to efficiently manage a battery by measuring an SOC and an energy storage amount of a battery within a short time.

In addition, in accordance with the embodiments of the present invention, the energy storage amount of the battery is measured during a charging time of an electric vehicle and is continuously managed so that it is possible to efficiently manage the battery of the electric vehicle.

Although the description has been made with reference to the embodiments of the present invention, it should be understood that various alternations and modifications of the present invention can be devised by those skilled in the art to which the present invention pertains without departing from the spirit and scope of the present invention, which are defined by the appended claims.

What is claimed is:

1. A method of managing a battery, comprising:
   performing first charging or discharging on the battery;
   measuring a first voltage according to an open circuit of the battery after a first time between a time point immediately after the first charging or discharging and a voltage recovery section before reaching a voltage stabilization period elapses;
   after the first charging or discharging, performing a second charging or discharging on the battery;
   measuring a second voltage according to the open circuit of the battery after a second time, which is equal to the first time, between a time point immediately after the second charging or discharging and a voltage recovery section before reaching the voltage stabilization period elapses;
   calculating a first SOC value ($SOC_1$) of a first state of charge (SOC) with respect to the first voltage and a second SOC value ($SOC_2$) of a second SOC with respect to the second voltage from a preset open circuit voltage (OCV)-SOC characteristic curve of the battery; and calculating a total energy storage amount ($Q_{max}$) of the battery using the first SOC value ($SOC_1$) and the second SOC value ($SOC_2$) to obtain a calculated total energy storage ($Q_{max}$) of the battery;

wherein the calculating of the total energy storage amount ($Q_{max}$) of the battery includes calculating an energy variance ($\Delta Q$) of the battery according to the second charging or discharging through a coulomb counting method and calculating the total energy storage amount ($Q_{max}$) of the battery using the first SOC value ($SOC_1$), the second SOC value ($SOC_2$), and the energy variance ($\Delta Q$) of the battery according to Equation below:

$$Q_{max} = \frac{\Delta Q}{SOC_1 - SOC_2}, \qquad \text{[Equation]}$$

wherein $\Delta Q$=integrated current value according to second charging or discharging =∫i dt.

2. The method of claim 1, further comprising, after the calculating of the total energy storage amount ($Q_{max}$) of the battery, determining a charging time point or a replacement time point of the battery according to the calculated total energy storage amount ($Q_{max}$) of the battery.

3. The method of claim 1, wherein the performing of the second charging or discharging on the battery includes performing the second charging or discharging on the battery within the voltage stabilization period according to the first charging or discharging.

4. The method of claim 1, wherein the performing of the second charging or discharging on the battery includes performing the second charging or discharging on the battery before reaching the voltage stabilization period according to the first charging or discharging after the first time.

5. A battery management system comprising:
   a load part configured to perform temporarily charging or discharging on a battery;
   a voltage measurement part configured to measure a voltage of the battery according to the performing of charging or discharging of the load part;
   an arithmetic operation part configured to calculate a state of charge (SOC) from a preset open circuit voltage (OCV)-SOC characteristic curve of the battery according to the voltage and calculate a total energy storage amount ($Q_{max}$) of the battery,
   wherein the load part performs first charging or discharging and second charging or discharging on the battery;
   wherein the voltage measurement part measures a first voltage according to an open circuit of the battery after a first time between a time point immediately after the first charging or discharging and a time point before reaching a voltage stabilization period elapses, and measures a second voltage according to the open circuit of the battery after a second time, which is equal to the first time, between a time point immediately after the second charging or discharging and a time point before reaching the voltage stabilization period elapses;
   wherein the arithmetic operation part calculates a first SOC value ($SOC_1$) with respect to the first voltage and a second SOC value ($SOC_2$) with respect to the second voltage from a preset OCV-SOC characteristic curve of the battery and calculates the total energy storage amount ($Q_{max}$) of the battery using the first SOC value ($SOC_1$) and the second SOC value ($SOC_2$); and
   wherein the arithmetic operation part calculates an energy variance ($\Delta Q$) of the battery according to the second charging or discharging through a coulomb counting method and calculates the total energy storage amount ($Q_{max}$) of the battery using the first SOC value ($SOC_1$), the second SOC value ($SOC_2$), and the energy variance ($\Delta Q$) of the battery according to Equation below:

$$Q_{max} = \frac{\Delta Q}{SOC_1 - SOC_2}, \qquad \text{[Equation]}$$

wherein $\Delta Q$=integrated current value according to second charging or discharging =∫i dt.

6. The battery management system of claim 5, wherein the load part performs the second charging or discharging on the battery within the voltage stabilization period according to the first charging or discharging.

7. The battery management system of claim 5, wherein the load part performs the second charging or discharging on the battery before reaching the voltage stabilization period according to the first charging or discharging after the first time.

8. An electric vehicle charging system having a battery management system, comprising:
   a charging device including a charging device main body and a charging connector connected to the charging device main body through a cable and connected to a charging port of an electric vehicle;
   a load part provided in the charging device and configured to perform charging or discharging on a battery in a state in which the charging connector is connected to an electric vehicle;
   a voltage measurement part provided in the charging device and configured to measure a voltage of the battery according to the performing of charging or discharging of the load part; and
   an arithmetic operation part configured to calculate a state of charge (SOC) from a preset open circuit voltage (OCV)-SOC characteristic curve of the battery according to the voltage and calculate a total energy storage amount ($Q_{max}$) of the battery,
   wherein the load part performs first charging or discharging and second charging or discharging on the battery;
   wherein the voltage measurement part measures a first voltage according to an open circuit of the battery after a first time between a time point immediately after the first charging or discharging and a time point before reaching a voltage stabilization period elapses and measures a second voltage according to the open circuit of the battery after a second time, which is equal to the first time, between a time point immediately after the second charging or discharging and a time point before reaching the voltage stabilization period elapses;
   wherein the arithmetic operation part calculates a first SOC value ($SOC_1$) with respect to the first voltage and a second SOC value ($SOC_2$) with respect to the second voltage from a preset OCV-SOC characteristic curve of the battery and calculates the total energy storage amount ($Q_{max}$) of the battery using the first SOC value ($SOC_1$) and the second SOC value ($SOC_2$); and
   wherein the arithmetic operation part calculates an energy variance ($\Delta Q$) of the battery according to the second charging or discharging through a coulomb counting method and calculates the total energy storage amount ($Q_{max}$) of the battery using the first SOC value ($SOC_1$), the second SOC value ($SOC_2$), and the energy variance ($\Delta Q$) of the battery according to Equation below:

$$Q_{max} = \frac{\Delta Q}{SOC_1 - SOC_2}, \qquad \text{[Equation]}$$

wherein $\Delta Q$=integrated current value according to second charging or discharging =∫i dt.

9. The electric vehicle charging system of claim 8, further comprising a first wireless communication part configured to communicate with a mobile terminal of a user, wherein the first wireless communication part transmits the first voltage and the second voltage to the mobile terminal of the user.

10. The electric vehicle charging system of claim 9, further comprising:
a second wireless communication part configured to communicate with the mobile terminal of the user; and
a battery management server equipped with the arithmetic operation part.

11. The electric vehicle charging system of claim 10, wherein the arithmetic operation part calculates the total energy storage amount ($Q_{max}$) of the battery using the first voltage and the second voltage through an energy storage amount calculation algorithm and transmits the total energy storage amount ($Q_{max}$) of the battery to the mobile terminal of the user through the second wireless communication part.

12. The electric vehicle charging system of claim 8, wherein the load part performs the second charging or discharging on the battery within the voltage stabilization period according to the first charging or discharging.

13. The electric vehicle charging system of claim 8, wherein the load part performs the second charging or discharging on the battery before reaching the voltage stabilization period according to the first charging or discharging after the first time.

* * * * *